United States Patent [19]

Truong et al.

[11] Patent Number: 5,450,417
[45] Date of Patent: Sep. 12, 1995

[54] CIRCUIT FOR TESTING POWER-ON-RESET CIRCUITRY

[75] Inventors: Phat C. Truong, Houston; Tim M. Coffman, Sugar Land; Sung-Wei Lin, Houston, all of Tex.; T. Damodar Reddy, Nalgonda, India; Dennis R. Robinson, Needville, Tex.

[73] Assignee: Texas Instruments Incorporated, Dallas, Tex.

[21] Appl. No.: 149,243

[22] Filed: Oct. 26, 1993

[51] Int. Cl.⁶ .............................................. H04B 17/00
[52] U.S. Cl. ................................. 371/22.1; 371/22.5; 364/492; 327/198; 395/750
[58] Field of Search ............... 364/246.6, 246.91, 273.4, 364/273.5, 492–947.2, 964.9; 371/12–14, 21.1, 22.1, 22.5–22.6, 25.1; 395/525; 327/77, 143, 198

[56] References Cited

U.S. PATENT DOCUMENTS

| | | | |
|---|---|---|---|
| 4,512,019 | 4/1985 | Bodig et al. | 371/12 |
| 4,513,417 | 4/1985 | Lamb et al. | 371/12 |
| 4,591,745 | 5/1986 | Shen | 307/592 |
| 4,812,677 | 3/1989 | Perry | 371/66 |
| 4,841,233 | 6/1989 | Yoshida | 371/21 |
| 4,874,965 | 10/1989 | Campardo et al. | 307/272.3 |
| 5,245,577 | 9/1993 | Duesman et al. | 371/21.1 |
| 5,349,586 | 9/1994 | Katsuta | 371/22.1 |
| 5,369,310 | 11/1994 | Badyal et al. | 327/198 |
| 5,376,835 | 12/1994 | Van Buskirk et al. | 327/198 |

*Primary Examiner*—Emanuel T. Voeltz
*Assistant Examiner*—Craig Steven Miller
*Attorney, Agent, or Firm*—Theodore D. Lindgren; Leo N. Heiting; Richard L. Donaldson

[57] ABSTRACT

The power-on-reset test circuit of this invention includes two imbalanced latches to detect the occurrence of a transient power-on-reset signal. The occurrence of a transient power-on-reset signal is latched for later verification during circuit testing. Both latches are designed to default to a low voltage output (Vss) on initial power-up. One of the latches is set by the power-on-reset signal to a high-voltage output (Vcc) state. The other latch is set by a reference-potential input to a low-voltage output state. If the set latch has a high-voltage output and the other latch has a low-voltage output, then the power-on-reset circuitry is functioning properly.

5 Claims, 2 Drawing Sheets

CIRCUIT FOR TESTING POWER-ON-RESET CIRCUITRY

BACKGROUND OF THE INVENTION

The present invention relates to integrated-circuits and, in particular, to a circuit and method for testing power-on-reset circuitry in integrated circuits.

Many integrated circuits include power-on-reset circuitry to generate an automatic power-on-reset pulse. The power-on-reset pulse is used to initialize the integrated-circuit system during the "power-up" sequence that manages the transient conditions at the time the power supply Vcc is connected. When an integrated circuit has power-on-reset circuitry residing on-chip, one problem is the determination whether or not that power-on-reset circuitry functions properly. Preferably, the determination should be made without use of probes during manufacture and without dismantling the integrated-circuit chip after manufacture.

The output of the power-on-reset circuitry is a transient, one-shot pulse generated at the time the supply voltage Vcc is coupled to the circuit. This one-shot pulse is used, for example, to reset latches in the integrated circuit. Since the latches can default to the correct state without the need of the power-on-reset signal during the power-up sequence, the integrated circuit and/or system may function properly whether or not the power-on-reset circuitry is functioning properly.

In the prior-art, automatic test equipment has been used to directly observe the power-on-reset pulse. While the latches requiring initialization by the power-on-reset pulse have been observed to insure that the latches are in an initialized state, that observation has provided no guarantee that the latches are in the initialized state because of a reset pulse. That is, the latches may simply have randomly fallen into an initialized state during the power-up sequence.

The problem is to find an efficient way to determine, without probes or dismantling, whether or not the power-on-reset circuitry of an integrated circuit generates a power-on-reset pulse during the start-up (power-up) sequence of operation.

SUMMARY OF THE INVENTION

The power-on-reset test circuit of this invention includes two imbalanced latches to detect the occurrence of a transient power-on-reset signal. The occurrence of a transient power-on-reset signal is latched for later verification during circuit testing. Both latches are designed to default to a low voltage output (Vss) on initial power-up. However, one of the latches is set by the power-on-reset signal to a high-voltage output (Vcc) state. If the set latch has a high-voltage output and the other latch has a low-voltage output, then the power-on-reset circuitry is functioning properly.

An advantage of the circuit of this invention is that it requires a simple reading of the output data to determine whether or not the power-on-reset circuitry is functioning properly. Another advantage is that the circuit provides simple and easy access to that information.

The circuit of this invention is used, for example, in flash EPROM memories to detect whether or not a power-on-reset pulse is generated during power-up. In those memories, the power-on-reset pulse is used to prevent undesired alteration (programming or erasure) of the device during power-up.

DETAILED DESCRIPTION OF THE INVENTION

The invention is applicable to any electronic system/circuit implemented with CMOS devices where detection of a transient pulse during the power-on-reset sequence is desired. An EEPROM memory is used by way of example to describe the invention.

Figure 1:
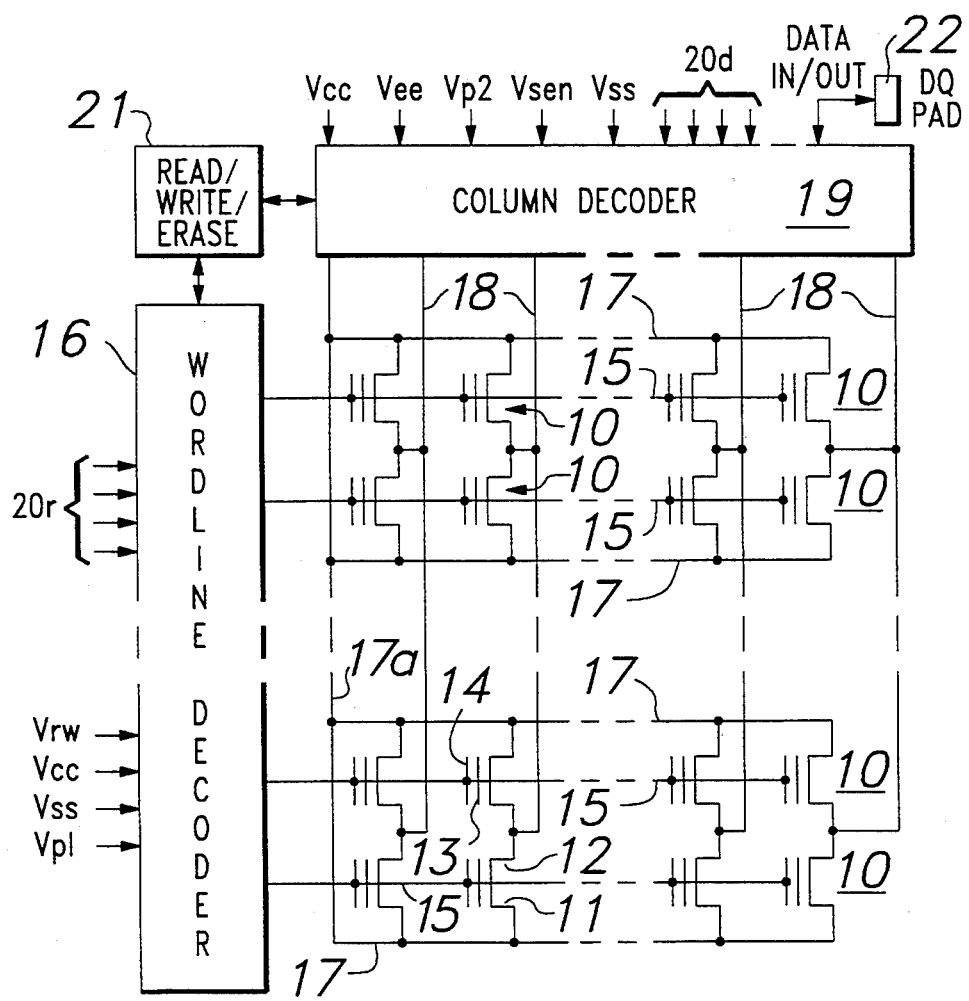
FIG. 1 is an electrical schematic diagram, in partial block form, of a flash EPROM memory in which; circuit and method of this invention may be used.

Referring to FIG. 1, an example array of memory cells, which is an integral part of a memory chip, is shown for the purpose of illustrating use of the method of this invention. Each cell is a floating-gate transistor 10 having a source 11, a drain 12, a floating gate 13, a control gate 14. Each of the control gates 14 in a row of cells 10 is connected to a wordline 15, and each of the wordlines 15 is connected to a wordline decoder 16. Each of the sources 11 in a row of cells 10 is connected to a source line 17. Each of the drains 12 in a column of cells 10 is connected to a drain-column line 18. Each of the source lines 17 is connected by a common-column line 17a to a column decoder 19 and each of the drain-column lines 18 is connected to the column decoder 19.

In the read mode, the wordline decoder 16 functions, in response to wordline address signals on lines 20r and to signals from Read/Write/Erase control circuit 21, (which may include circuitry of an external microprocessor, not shown), to apply a preselected positive voltage Vcc (approx. +5 V) to the selected wordline 15, and to apply a low voltage (ground or Vss) to deselected wordlines 15. The column decoder 19 functions to apply a preselected positive voltage Vsen (approx. +1 V) to at least the selected drain-column line 18 and to apply a low voltage (0 V) to the source line 17. The column decoder 19 also functions, in response to signal on address lines 20d, to connect the selected drain-column line 18 of the selected cell 10 to the DATA IN/OUT terminal. The conductive or nonconductive state of the cell 10 connected to the selected drain-column line 18 and the selected wordline 15 is detected by a sense amplifier (not shown) connected to the DATA IN/OUT terminal 22.

In a write, or program, mode the wordline decoder 16 may function, in response to wordline address signals on lines 20r and to signals from Read/Write/Erase control circuit 21, to place a preselected first programming voltage Vp1 (approx. +12 V) on a selected wordline 15, including a selected control-gate 14. Column decoder 19 also functions to place a second programming voltage Vp2 (approx. +5 to +10 V) on a selected drain-column line 18 and, therefore, the drain 12 of selected cell 10. Source lines 17 are connected to reference potential Vss, which may be ground. All of the deselected drain-column lines 18 are connected to reference potential Vss or are floated. These programming voltages create a high current (drain 12 to source 11) condition in the channel of the selected memory cell 10, resulting in the generation near the drain-channel junction of channel-hot electrons and avalanche-breakdown electrons that are injected across the channel oxide to the floating gate 13 of the selected cell 10. The programming time is selected to be sufficiently long to program the floating gate 13 with a negative program charge of approximately +2 V to −6 V with respect to the channel region (with Vp1 at 0 V). For memory cells 10 fabricated in accordance with the example embodiment, the coupling coefficient between a control gate 14/wordline 15 and a floating gate 13 is approximately 0.6. Therefore, a prior-art programming voltage Vp1 of 12 V, for example, on a selected wordline 15, including the selected control gate 14, places a voltage of approximately +7.2 V on the selected floating gate 13. The voltage difference between the floating gate 13 (at approx. +7.2 V) and the grounded (approx. 0v) source line 17 is insufficient to cause a Fowler-Nordheim tunneling current across the gate oxide between source 11 and floating gate 13 to charge the floating gate 13 of a selected or deselected cell 10. The floating gate 13 of the selected cell 10 is charged with hot electrons injected during programming, and the electrons in turn render the source-drain path under the floating gate 13 of the selected cell 10 nonconductive, a state which is read as a "zero" bit. Deselected cells 10 have source-drain paths under the floating gate 13 that remain conductive, and those cells 10 are read as "one" bits.

In a flash-erase mode, the column decoder 19 functions to leave all drain-column lines 18 floating (connected to a high impedance such as field-effect transistor biased in "OFF" condition). The wordline decoder 1.6 functions to connect all the wordlines 15 to reference potential Vss, which may be ground. The column decoder 19 also functions to apply a high positive voltage Vee (approx. +9 V to +15 V) to all the source lines 17. These erasing voltages create sufficient field strength across the gate oxide region to generate a Fowler-Nordheim tunnel current that transfers charge from the floating gate 13, erasing the memory cell 10.

For convenience, a table of read, write and erase voltages, is given in TABLE I below:

TABLE I

|  | Read | Write | Flash Erase |
| --- | --- | --- | --- |
| Selected Wordline | 5V | 12V | 0V (All) |
| Deselected Wordlines | 0V | 0V | — |
| Selected Drain Line | 1.0V | 5–10V | Float (All) |
| Deselected Drain Lines | 0V/Float | 0V/Float | — |
| Source Lines | 0V | 0V | 9–15V (All) |

Figure 2:
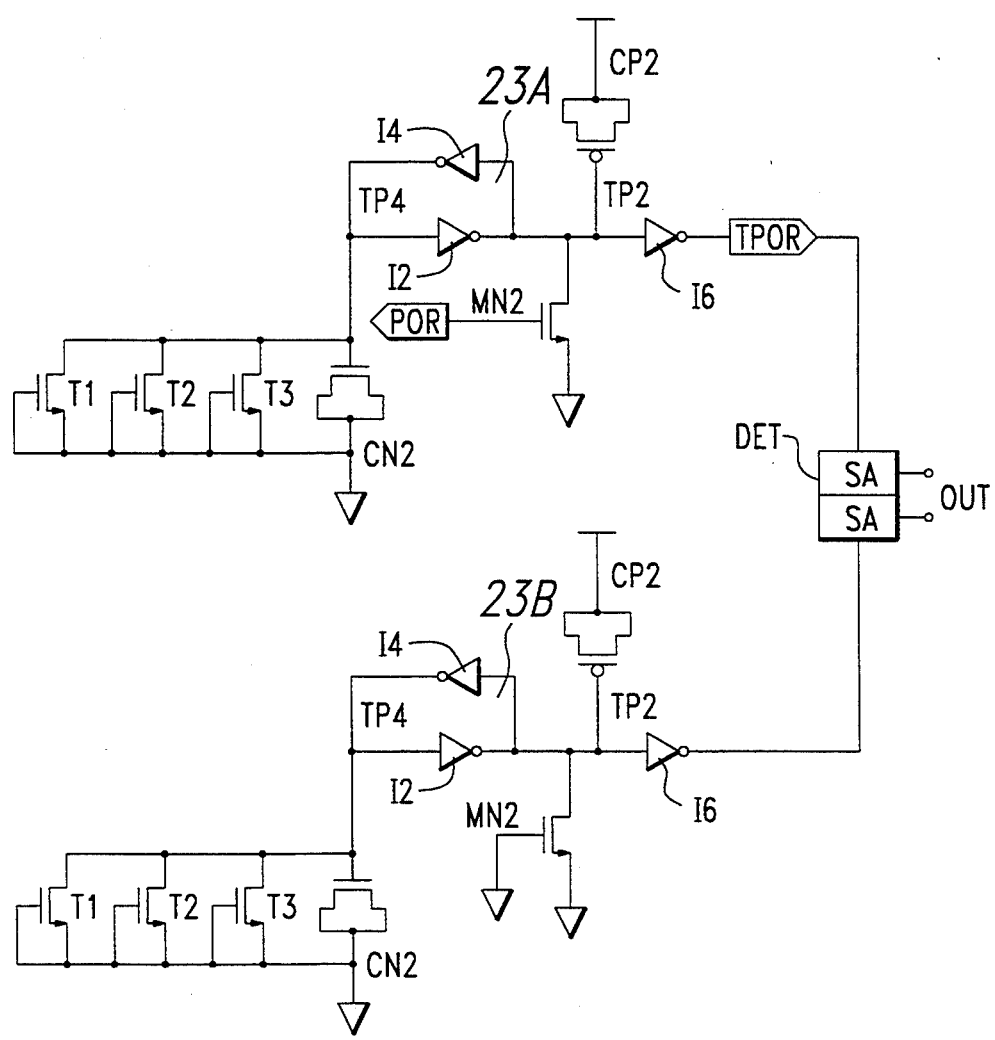
FIG. 2 is a schematic diagram of the circuit of this invention and, in particular, of the latch circuit for implementing the special test for power-on-reset circuitry.

The circuit of FIG. 2, which may be a part of control circuit 21, permits determination as to whether or not the power-on-reset circuitry is functioning properly. The power-on-reset circuitry may also be a part of control circuit 21.

Two ratioed inverters I2 and I4 form a latch 23A that favors reading zero (low voltage or Vss) at the output TPOR. Capacitor CN2 is connected between node TP4 and terminal Vss to keep node TP4 near the level of reference voltage at terminal Vss during power-up. Capacitor CN2 may, for example, be a N-channel transistor having channel length of 10 microns and channel width of 30 microns. Capacitor CP2 is connected between node TP2 and terminal Vcc to keep node TP2 near the level of supply voltage applied to terminal Vcc during power-up. Capacitor CP2 may, for example, be a P-channel transistor having a channel length of 10 microns and a channel width of 30 microns. The source-drain path of a N-channel transistor MN2 is connected between node TP2 and terminal Vss. The gate of transistor MN2 is connected to the power-on-reset signal at terminal POR. During power-up, if a power-on-reset signal is not generated at terminal POR, then the output of the circuit at terminal TPOR will be reference voltage because the circuit defaults to reference voltage at terminal Vss. Three N-channel transistors T1–3 with gates tied to reference terminal Vss are connected to node TP4 to compensate for any sub-threshold leakage in the latch 23A, which may cause the latch 23A to imbalance or to default node TP4 incorrectly. Resistive transistors T1–3 may, for example, each have a channel with a length-to-width ratio of 0.9-to-10.

Ratioed inverter I2 may comprise, for example, a P-channel transistor with source-drain path coupled between supply voltage Vcc and the output and a N-channel transistor with source-drain path coupled between the output and reference potential Vss, both gates coupled to the input. The channel of the P-channel transistor may, for example, have a length-to-width ratio of four-to-three and the channel of the N-channel resistor may, for example, also have a length-to-width ratio of twelve-to-four.

Ratioed inverter I4 may also comprise, for example, a P-channel transistor with source-drain path coupled between supply voltage Vcc and the output and a N-channel transistor with source-drain path coupled between the output and reference potential Vss, both gates coupled to the input. The channel of the P-channel transistor may, for example, have a length-to-width ratio of six-to-four and the channel of the N-channel resistor may, for example, also have a length-to-width ratio of six-to-four.

To make certain that the latch 23A defaults correctly to cause reference voltage Vss at the circuit output, a second identical latch circuit 23B may be used, except that the power-on-reset signal input at the POR terminal is tied to reference voltage at terminal Vss. By comparing the output of this identical latch circuit 23B, which is initialized at zero volts, while the first circuit receiving the power-on-reset signal input at its POR terminal is reset to one (Vcc); determination by detection circuit DET is made as to whether or not the power-on-reset circuitry that generates the power-on-reset signal is functioning properly. Detection circuit DET may be an exclusive OR circuit with output coupled to pin of the integrated circuit. In one embodiment, the outputs terminals TPOR are each coupled to a sense amplifier SA already coupled to an output pin. The voltages at the output pins are read in exclusive OR manner to determine whether or not the power-on reset circuit is functioning properly.

The use of two identical latches 23A and 23B, one of which is reset by the power-on-reset signal, allows a static reading to determine whether or not the power-on-reset signal is functioning properly. The two identical latches 23A and 23B also allow detection of a latch defaulting to the incorrect state. If this occurs, both latches default to a high voltage.

The method described herein for testing a power-on-reset circuit of an integrated-circuit comprises (1) coupling the power-on-reset signal to the input of a first latch to cause the output of the first latch to change from a default voltage to a voltage different from the voltage at a reference-potential electrode; (2) coupling the reference potential electrode to the input of a second latch to cause the second latch to have an output at the default voltage; and (3) determining if the voltage at the output of the first latch differs from the voltage at the output of the second latch.

While this invention has been described with respect to an illustrative embodiment, this description is not intended to be construed in a limiting sense. Upon reference to this description, various modifications of the illustrative embodiment, as well as other embodiments of the invention, will be apparent to persons skilled in the art. It is contemplated that the appended claims will cover any such modifications or embodiments that fall within the scope of the invention.

We claim:

1. A test circuit for a power-on-reset circuit of an integrated-circuit, said integrated-circuit having a reference-potential electrode and at least one data electrodes, said power-on-reset circuit having an output normally providing a power-on-reset signal at power-on, said test circuit comprising:
    a first latch and a second latch, each said first and second latch having an output, each said output of said first and second latches normally providing a default voltage;
    said first latch coupled to receive a power-on-reset signal from said output of said power-on-reset circuit, said output of said first latch providing a second voltage different from said default voltage upon receiving a power-on-reset signal;
    said second latch coupled to receive a signal from said reference-potential electrode; and
    an exclusive OR circuit having first and second inputs and an output, said outputs of said first and second latches respectively coupled respectively to said first and second inputs of said exclusive OR circuit, said output of said exclusive OR circuit coupled to said data electrode of said integrated circuit.

2. The circuit of claim 1, wherein at least one of said latches includes two ratioed inverters.

3. The circuit of claim 1, wherein said first latch includes first and second inverters, each said first and second inverter having an input and an output, said input of said first inverter coupled to said input of said first latch, said output of said first inverter coupled to said output of said first latch, said output of said second inverter coupled to said input of said first latch, said input of said second inverter coupled to said output of said first latch.

4. The circuit of claim 1, wherein said default voltage is equal to a voltage at said reference potential terminal.

5. The circuit of claim 1, said integrated circuit further including a sense amplifier respectively coupled to said data electrode, wherein said outputs of said exclusive OR circuit is coupled to said data electrode by said sense amplifier.

* * * * *